United States Patent
Lee et al.

(10) Patent No.: US 8,614,014 B2
(45) Date of Patent: Dec. 24, 2013

(54) TRACKS INCLUDING MAGNETIC LAYER AND MAGNETIC MEMORY DEVICES COMPRISING THE SAME

(75) Inventors: Sung-chul Lee, Osan-si (KR); Sun-ae Seo, Hwaseong-si (KR); Young-jin Cho, Suwon-si (KR); Ung-hwan Pi, Seoul (KR); Jin-seong Heo, Daejeon (KR); Ji-young Bae, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 691 days.

(21) Appl. No.: 12/662,215

(22) Filed: Apr. 6, 2010

(65) Prior Publication Data

US 2011/0045318 A1    Feb. 24, 2011

(30) Foreign Application Priority Data

Aug. 19, 2009    (KR) .................. 10-2009-0076737

(51) Int. Cl.
*G11B 5/66*    (2006.01)
*G11C 19/02*    (2006.01)

(52) U.S. Cl.
USPC ............... 428/831; 365/81; 365/87; 365/171

(58) Field of Classification Search
None
See application file for complete search history.

(56) References Cited

U.S. PATENT DOCUMENTS

| 6,579,635 | B2   | 6/2003  | Krusin-Elbaum |
| 7,684,236 | B2 * | 3/2010  | Lim et al. ............... 365/171 |
| 7,910,232 | B2 * | 3/2011  | Lee et al. ............... 428/832 |

FOREIGN PATENT DOCUMENTS

| JP | 2007-067863 | 3/2007 |
| JP | 2007-0324276 | 12/2007 |
| JP | 2008-0227431 | 9/2008 |
| JP | 2008-227431 | * 9/2008 |
| KR | 10-0790885 | 12/2007 |
| KR | 2009-0011013 | 1/2009 |
| KR | 2009-0016307 | 2/2009 |

OTHER PUBLICATIONS

English machine translation of JP 2008-227431, NEC Corp, Sep. 2008, Japan, pp. 1-7.*
Parkin et al., "Magnetic Domain-Wall Racetrack Memory," Science, vol. 320, pp. 190-194, Apr. 2008.*
T.A. Moore, et al., "High domain wall velocities induced by current in ultrathin Pt/Co/AlOx wires with perpendicular magnetic anisotropy", Applied Physics Letters 93, 262504 (2008), pp. 1-3.
Gen Tatara, et al., "Threshold Current of Domain Wall Motion under Extrinsic Pinning, β-Term and Non-Adiabaticity", J. Phys. Soc. Jpn. 75 (2006), pp. 1-15.
H. Cercellier, et al., "Interplay between structural, chemical, and spectroscopic properties of Ag/Au(111) epitaxial ultrathin films: A way to tune the Rashba coupling", Physical Review B 73, 195413 (2006), pp. 1-16.
I. M. Miron, et al., "Domain Wall Spin Torquemeter", Physical Review Letters 102, 137202 (2009), pp. 1-4.

* cited by examiner

*Primary Examiner* — Holly Rickman
(74) *Attorney, Agent, or Firm* — Harness, Dickey & Pierce, P.L.C.

(57) ABSTRACT

A magnetic memory device includes a track in which different non-magnetic layers are respectively formed on upper and lower surfaces of a magnetic layer. One of the two non-magnetic layers includes an element having an atomic number greater than or equal to 12. Accordingly, the magnetic layer has a relatively high non-adiabaticity (β).

25 Claims, 4 Drawing Sheets

TRACKS INCLUDING MAGNETIC LAYER AND MAGNETIC MEMORY DEVICES COMPRISING THE SAME

CROSS-REFERENCE TO RELATED APPLICATION

This application claims priority under 35 U.S.C. §119 to Korean Patent Application No. 10-2009-0076737, filed on Aug. 19, 2009, in the Korean Intellectual Property Office, the entire contents of which are incorporated herein by reference.

BACKGROUND

1. Field

Example embodiments relate to tracks including magnetic layers and magnetic memory devices including the tracks.

2. Description of the Related Art

Non-volatile information storage devices retain recorded information even when power is cut off. Conventional non-volatile memories include hard disk drives (HDDs), non-volatile random access memories (RAMs), etc.

Conventional HDDs utilize a rotating mechanical device as a storage device. This rotating mechanical device may wear down and fail. As a result, conventional HDDs have relatively low reliability.

A representative example of a non-volatile RAM is a flash memory. Although conventional flash memory devices do not use a rotating mechanical device, flash memory devices have lower reading and writing speeds, shorter lifetimes, and smaller storage capacities than conventional HDDs. Also, conventional flash memory devices have relatively high manufacturing costs.

Another type of information storage device uses motion of a magnetic domain wall of a magnetic material. A magnetic domain is a minute magnetic region in which magnetic moments are arranged in one direction in a ferromagnetic material. A magnetic domain wall is a border region between magnetic domains having different magnetization directions. A magnetic domain wall formed between magnetic domains may be moved by supplying a current to a magnetic track. Using magnetic domain wall motion, it is expected that an information storage device having a relatively large storage capacity may be realized without using a rotating mechanical device. However, to commercialize an apparatus using magnetic domain wall motion, a critical current at which a magnetic domain and a magnetic domain wall are moved needs to be reduced. If the critical current is relatively high, power consumption is relatively high and a magnetic body is heated by Joule heating, which causes various problems. Also, a size of a driving device or a switching device for applying a current also needs to be increased, which hinders increases in the integration degree of magnetic memory devices.

SUMMARY

Example embodiments provide tracks including a magnetic layer capable of moving magnetic domain walls, magnetic memory devices including the tracks.

According to at least one example embodiment, a magnetic memory device includes: a track; a magnetic domain wall moving unit connected to the track; and a read/write unit configured to reproduce/record information with respect to the track. The track includes: a magnetic layer; a first non-magnetic layer formed on a first surface of the magnetic layer; and a second non-magnetic layer formed on a second surface of the magnetic layer. The magnetic layer includes a plurality of magnetic domains and a magnetic domain wall between each pair of adjacent magnetic domains. The first and second surfaces are opposite to one another. For example, the first surface is one of an upper and lower surface of the magnetic track, and the second surface is the other of the upper and lower surfaces of the magnetic track. The second non-magnetic layer is formed of a different material than the first non-magnetic layer. For example, the second non-magnetic layer may include magnesium (Mg) and at least one selected from the group consisting of or including metals having an atomic number greater than or equal to 14. The metal having an atomic number greater than or equal to 14 may include at least one selected from the group consisting of or including Cr, Ru, Pd, Ta, and Pt.

According to at least some example embodiments, the magnetic layer may have perpendicular magnetic anisotropy. The magnetic layer may be formed of at least one selected from the group consisting of or including Co, CoFe, CoFeB, CoCr, and CoCrPt. The first non-magnetic layer may be an orientation layer by which magnetization of the magnetic layer is perpendicularly oriented. The first non-magnetic layer may be a metal layer Including, for example, Pd or Pt.

According to at least some example embodiments, the second non-magnetic layer may be a metal oxide layer. The non-adiabaticity (β) of the magnetic layer may be greater than or equal to about 0.1.

According to at least one other example embodiment, a magnetic memory device includes: a track; a magnetic domain wall moving unit connected to the track; and a read/write unit configured to reproduce/record information with respect to the track. The track includes: a magnetic layer; a thermal-conductive insulating layer formed on a first surface of the magnetic layer; and a non-magnetic layer formed on a second surface of the magnetic layer. The magnetic layer includes a plurality of magnetic domains and a magnetic domain wall between each pair of adjacent magnetic domains. The non-magnetic layer includes a metal having an atomic number greater than or equal to 12. In this example embodiment, the first surface is a lower surface of the magnetic layer, and the second surface is an upper surface of the magnetic layer.

According to at least some example embodiments, the non-magnetic layer may be a metal oxide layer. The metal having an atomic number greater than or equal to 12 may include at least one selected from the group consisting of or including Mg, Al, Cr, Ru, Pd, Ta, and Pt. The magnetic layer may have perpendicular magnetic anisotropy. For example, the magnetic layer may be formed of at least one selected from the group consisting of or including Co, CoFe, CoFeB, CoCr, and CoCrPt. The thermal-conductive insulating layer may be an orientation layer by which magnetization of the magnetic layer is perpendicularly oriented. The thermal-conductive insulating layer may include AlN. The non-adiabaticity (β) of the magnetic layer may be greater than or equal to about 0.1.

At least one other example embodiment provides a magnetic memory device including: a track; a magnetic domain wall moving unit connected to the track; and a read/write unit configured to reproduce/record information with respect to the track. The track includes: a magnetic layer; a first non-magnetic layer formed on a first surface of the magnetic layer; a second non-magnetic layer formed on a second surface of the magnetic layer and including a metal having an atomic number greater than or equal to 12; and an insertion layer disposed between the magnetic layer and the second non-magnetic layer. The magnetic layer includes a plurality of magnetic domains and a magnetic domain wall between each pair of adjacent magnetic domains. The insertion layer includes a metal having an atomic number greater than or equal to 14. A metal concentration of the insertion layer is higher than a metal concentration of the second non-magnetic layer. The metal having an atomic number greater than or equal to 12 may include at least one selected from the group consisting of or including Mg, Al, Cr, Ru, Pd, Ta, and Pt. In this example embodiment, the first surface is one of an upper and lower surface of the magnetic layer, and the second surface is the other of the upper and lower surface of the magnetic layer. The first and second surfaces are opposite to one another.

According to at least some example embodiments, the magnetic layer may have perpendicular magnetic anisotropy. For example, the magnetic layer may be formed of at least one selected from the group consisting of or including Co, CoFe, CoFeB, CoCr, and CoCrPt. The first non-magnetic layer may be an orientation layer by which magnetization of the magnetic layer is perpendicularly oriented. The first non-magnetic layer may be a metal layer or an insulating layer. The metal layer may include Pd or Pt, and the insulating layer may include AlN. The second non-magnetic layer may be a metal oxide layer. The insertion layer may be a metal layer or a metal oxide layer. The insertion layer may include at least one selected from the group consisting of or including Cr, Ru, Pd, Ta, and Pt, and a thickness of the insertion layer may be less than or equal to about 1 nanometer (nm). The atomic number of a metal included in the insertion layer may be greater than or equal to the atomic number of a metal included in the second non-magnetic layer. The non-adiabaticity ($\beta$) of the magnetic layer may be greater than or equal to about 0.1.

BRIEF DESCRIPTION OF THE DRAWINGS

Example embodiments will become apparent and more readily appreciated from the following description of the drawings in which.

DETAILED DESCRIPTION

Figure 1:
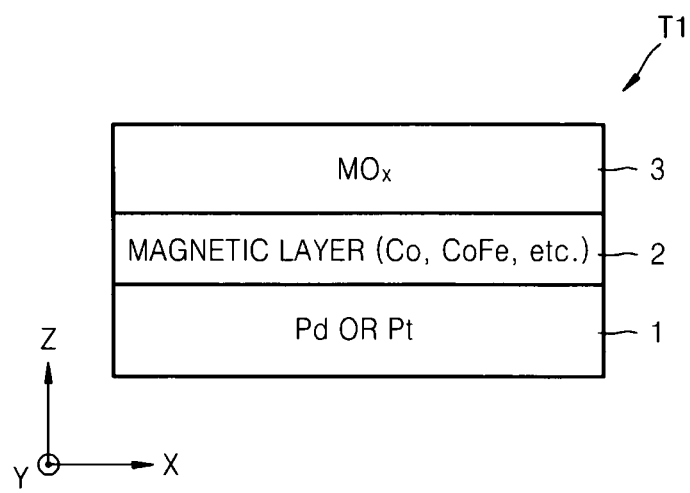
FIGS. 1 through 5 are cross-sectional views illustrating tracks according to various example embodiments.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain aspects of the present description.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. The embodiments may, however, may be altered and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a cross-sectional view illustrating a track according to an example embodiment.

Referring to FIG. 1, the track T1 has a multi-layer structure in which a first non-magnetic layer 1, a magnetic layer 2, and a second non-magnetic layer 3 are stacked sequentially. In this example, the first non-magnetic layer 1 is formed on a lower surface of the magnetic layer 2, and the second non-magnetic layer 3 is formed on an upper surface of the magnetic layer 2. The track T1 extends in, for example, a Y-axis direction.

The magnetic layer 2 may have a plurality of magnetic domains serially arranged in the extension direction of the track T1 (e.g., the Y-axis direction). A magnetic domain wall may be formed between each pair of adjacent magnetic domains. The magnetic layer 2 may have perpendicular magnetic anisotropy. In this case, the magnetic layer 2 may include a cobalt (Co)-based material. For example, the magnetic layer 2 may be formed of at least one selected from the group consisting of or including Co, CoFe, CoFeB, CoCr, and CoCrPt.

The first non-magnetic layer 1 may be an orientation layer that perpendicularly orients magnetization of the magnetic layer 2. In this case, a magnetization easy axis of the magnetic layer 2 is set along a Z-axis by the first non-magnetic layer 1, and the magnetic layer 2 has a perpendicular magnetic anisotropy. The first non-magnetic layer 1 may be a metal layer including, for example, Pd or Pt. More specifically, in this example, the first non-magnetic layer 1 may be a Pd layer or a Pt layer. However, the material of the first non-magnetic layer 1 is not limited thereto.

The second non-magnetic layer 3 may be formed of a material that is different from the first non-magnetic layer 1. In this case, the track T1 has a vertically asymmetric structure with respect to the magnetic layer 2. In more detail, the second non-magnetic layer 3 may be a metal compound layer such as a metal oxide layer. For example, the second non-magnetic layer 3 may include a metal having an atomic number greater than or equal to 14, such as at least one selected from the group consisting of or including Cr, Ru, Pd, Ta, and Pt. The second non-magnetic layer 3 may include Mg instead of the metal having an atomic number greater than or equal to 14, or may further include Mg in addition to the metal. For example, the second non-magnetic layer 3 may be represented as $MO_x$, where M is a metal such as at least one selected from the group consisting of or including Mg, Cr, Ru, Pd, Ta, and Pt.

The thickness of the first non-magnetic layer 1 may be between about 0.5 nanometers (nm) and about 5.0 nm, inclusive. The thickness of the magnetic layer 2 may be between about 0.2 nm and about 1.0 nm, inclusive. The thickness of the second non-magnetic layer 3 may be between about 0.5 nm and about 3.0 nm, inclusive. A width of the track T1 in an X-axis direction may be between about 30 nm and about 1000 nm, inclusive.

When the first and second non-magnetic layers 1 and 3 are different, the track T1 has a vertically asymmetric structure. In this case, the second non-magnetic layer 3 includes an element having a relatively high atomic number (e.g., metal) as described above such that the non-adiabaticity ($\beta$) of the magnetic layer 2 may be increased. The higher the non-adiabaticity ($\beta$) of the magnetic layer 2, the easier magnetic moments of magnetic domains and magnetic domain walls are rotated. As a result, the magnetic domains and the magnetic domain walls may be moved more easily. Accordingly, a critical current density for moving the magnetic domains and the magnetic domain walls may decrease.

In more detail, when the track T1 has a vertically asymmetric structure as described above, an interface between the first non-magnetic layer 1 and the magnetic layer 2 (hereinafter referred to as a first interface) and an interface between the magnetic layer 2 and the second non-magnetic layer 3 (hereinafter referred to as a second interface) have different electric characteristics. Thus, an electric field may be generated between the first and second interfaces. For example, an electric field may be applied to the magnetic layer 2 in a direction from the second interface to the first interface. The electric field generates a Rashba effect, which results in an increase in a spin-flip rate of electrons moving through the magnetic layer 2. The Rashba effect refers to a phenomenon in which a magnetic field is applied to electrons moving under an electric field. Due to interaction between the magnetic field and the spin of the electrons, a spin-flip rate of the electrons may increase. The increase of the spin-flip rate of the electrons indicates a reduction in a spin-flip time ($\tau_{sf}$). The non-adiabaticity ($\beta$) of a magnetic layer may be denoted as energy exchange time ($\tau_{ex}$) divided by spin-flip time ($\tau_{sf}$) as shown below in Equation 1. When the spin flip time ($\tau_{sf}$) of the electrons decreases due to the Rashba effect, the non-adiabaticity ($\beta$) increases.

$$\beta = \frac{\tau_{ex}}{\tau_{sf}} \qquad \text{[Equation 1]}$$

In addition, when the second non-magnetic layer 3 includes an element having a relatively high atomic number (e.g., metal), the Rashba effect may be enhanced further because an element having a relatively high atomic number includes a relatively large number of protons in its nucleus. As a result, a relatively strong electric field may be generated. In this example, the higher the atomic number of the metal in the second non-magnetic layer 3, the stronger the electric field generated at the second interface, which refers to the interface between the magnetic layer 2 and the second non-magnetic layer 3. Accordingly, the Rashba effect may be enhanced, thereby further reducing the spin-flip time ($\tau_{sf}$) of electrons flowing through the track T1. This indicates an increase in the non-adiabaticity ($\beta$) of the magnetic layer 2. The non-adiabaticity ($\beta$) of the magnetic layer 2 may be greater than or equal to about 0.1. Accordingly, the critical current density of the track T1 for moving magnetic domains and magnetic domain walls may be reduced (e.g., considerably reduced). The above-described effect may also occur in other example embodiments, which will be described in more detail below. The non-adiabaticity ($\beta$) of a magnetic layer included in tracks described in more detail below may also be greater than or equal to about 0.1.

In FIG. 1, the positions of the first non-magnetic layer 1 and the second non-magnetic layer 3 may be interchanged. An example thereof is illustrated in FIG. 2.

Figure 2:
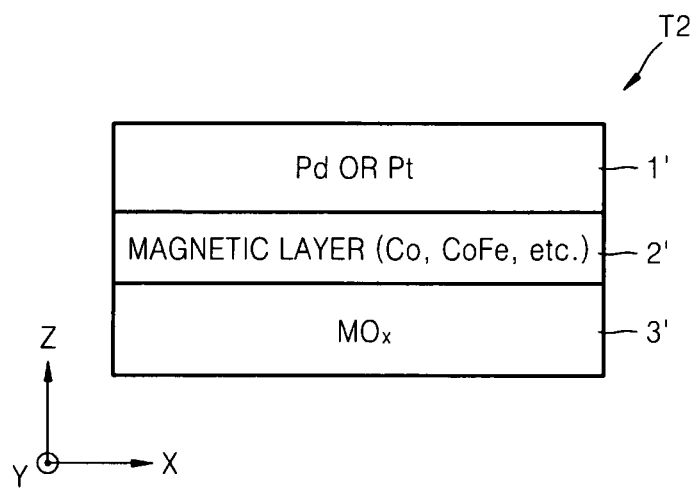

Referring to the example embodiment shown in FIG. 2, the track T2 has a structure in which a first non-magnetic layer 1' is formed above (e.g., on an upper surface of) the magnetic layer 2', and a second non-magnetic layer 3' is formed under (e.g., on a lower surface of) the magnetic layer 2'. The first non-magnetic layer 1', the second magnetic layer 2', and the second non-magnetic layer 3' may correspond to the first non-magnetic layer 1, the second magnetic layer 2, and the second non-magnetic layer 3, respectively, of FIG. 1. Even when the first non-magnetic layer 1' is formed on an upper surface of the magnetic layer 2' as illustrated in FIG. 2, the magnetization of the magnetic layer 2' may be perpendicularly oriented by the first non-magnetic layer 1' when the first non-magnetic layer 1' is a metal layer such as a Pd layer or a Pt layer.

Figure 3:
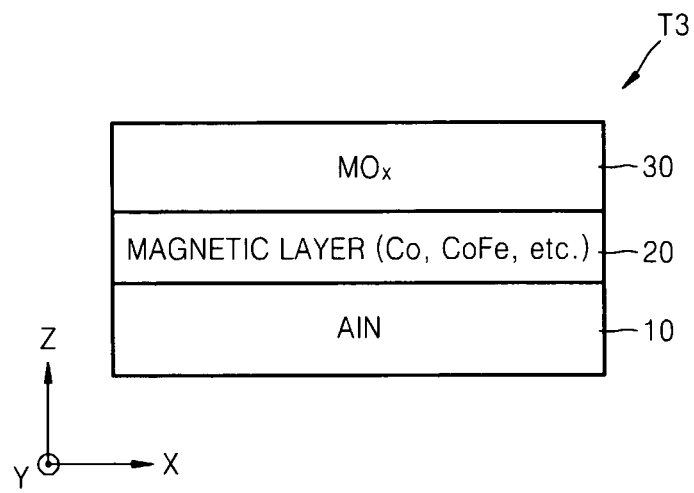

FIG. 3 is a cross-sectional view illustrating a track according to another example embodiment.

Referring to FIG. 3, a track T3 has a multi-layer structure in which a first non-magnetic layer 10, a magnetic layer 20, and a second non-magnetic layer 30 are stacked sequentially. The first non-magnetic layer 10 is formed on a lower surface of the magnetic layer 20, and the second non-magnetic layer 30 is formed on an upper surface of the magnetic layer 20. In this example embodiment, the track T3 extends in the Y-axis direction. The magnetic layer 20 may have the same or substantially the same structure as the magnetic layer 2 of FIG. 1.

Still referring to FIG. 3, the first non-magnetic layer 10 may be a thermal-conductive insulating layer. For example, the first non-magnetic layer 10 may be an aluminum nitride (AlN) layer, which has a thermal-conductivity k of about 230 J/(s·m·K). When the first non-magnetic layer 10 is a thermal-conductive insulating layer, heating of the magnetic layer 20 by a current applied to the track T3 for moving magnetic domain walls may be suppressed and/or prevented. For example, because heat generated in the magnetic layer 20 by the current may escape more easily through the first non-magnetic layer 10, deterioration of characteristics of the track T3 due to heating of the magnetic layer 20 may be controlled, suppressed and/or prevented. Also, when the first non-magnetic layer 10 is a thermal-conductive insulating layer, current flow to the first non-magnetic layer 10 for moving magnetic domains and magnetic domain walls is suppressed because the electric resistance of the first non-magnetic layer 10 is relatively high. As a result, current is concentrated on the magnetic layer 20. Accordingly, the magnetic domains and the magnetic domain walls of the magnetic layer 20 may be moved by using a current that is lower than a current used when the first non-magnetic layer 10 is a conductive layer.

In addition, even when the first non-magnetic layer 10 is a thermal-conductive insulating layer, the first non-magnetic layer 10 may perpendicularly orient the magnetization of the magnetic layer 20. In this example, a magnetization easy axis of the magnetic layer 20 may be set along a Z-axis by the first non-magnetic layer 10.

Still referring to FIG. 3, the second non-magnetic layer 30 may be formed of a different material than the first non-magnetic layer 10. Accordingly, the track T3 may have a vertically asymmetric structure. In more detail, the second non-magnetic layer 30 may be a metal compound layer such as a metal oxide layer. The second non-magnetic layer 30 may include a metal having an atomic number greater than or equal to 12. For example, the metal may include at least one selected from the group consisting of or including Mg, Al, Cr, Ru, Pd, Ta, and Pt. The second non-magnetic layer 30 may be represented as $MO_x$, where M is a metal and M may include at least one selected from the group consisting of or including Mg, Al, Cr, Ru, Pd, Ta, and Pt.

Thicknesses and widths of the first non-magnetic layer 10, the magnetic layer 20, and the second non-magnetic layer 30 may be similar or substantially similar to those of the first non-magnetic layer 1, the magnetic layer 2, and the second non-magnetic layer 3, respectively, of FIG. 1.

As described above, because the track T3 has a vertically asymmetric structure and the second non-magnetic layer 30 includes an element having a relatively high atomic number (e.g., metal), the non-adiabaticity (β) of the magnetic layer 20 may increase due to the Rashba effect, and density of a critical current for moving magnetic domains and magnetic domain walls may be lowered. The effect is similar or substantially similar to that described above with reference to FIG. 1. However, in this example embodiment the first non-magnetic layer 10 is a thermal-conductive insulating layer. Thus, the density of the critical current may be further reduced.

Figure 4:
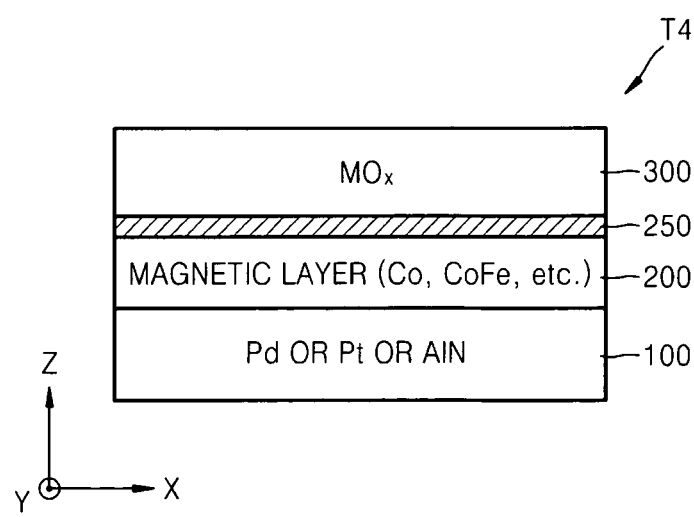

FIG. 4 is a cross-sectional view illustrating a track according to another example embodiment.

Referring to FIG. 4, a track T4 has a multi-layer structure in which a first non-magnetic layer 100, a magnetic layer 200, an insertion layer 250, and a second non-magnetic layer 300 are stacked sequentially. The track T4 may extend in a given, desired or predetermined direction (e.g., a Y-axis direction).

The first non-magnetic layer 100 may be a metal layer similar or substantially similar to the first non-magnetic layer 1 of FIG. 1 or an insulating layer similar or substantially similar to the first non-magnetic layer 10 of FIG. 3. For example, the metal layer may include Pd or Pt, and the insulating layer may include AlN. In more detail, the first non-magnetic layer 100 may be a metal layer such as a Pd layer or a Pt layer, or an insulating layer such as an AlN layer. The first non-magnetic layer 100 may perpendicularly orient magnetization of the magnetic layer 200.

The magnetic layer 200 may correspond to the magnetic layer 2 of FIG. 1. For example, the magnetic layer 200 may have perpendicular magnetic anisotropy. In this case, the magnetic layer 200 may be formed of a Co-based material such as at least one selected from the group consisting of or including Co, CoFe, CoFeB, CoCr, and CoCrPt.

The second non-magnetic layer 300 may correspond to the second non-magnetic layer 30 of FIG. 3. For example, the second non-magnetic layer 300 may be a metal compound layer such as a metal oxide layer (e.g., $MO_x$, where M is a metal). The second non-magnetic layer 300 may include a metal having an atomic number greater than or equal to 12. The metal may include at least one selected from the group consisting of or including Mg, Al, Cr, Ru, Pd, Ta, and Pt.

An insertion layer 250 is disposed between the magnetic layer 200 and the second non-magnetic layer 300. The insertion layer 250 may include a metal having an atomic number of greater than or equal to 14. A metal concentration of the insertion layer 250 may be higher than a metal concentration of the second non-magnetic layer 300. The atomic number of a metal contained in the insertion layer 250 may be greater than or equal to the atomic number of a metal included in the second non-magnetic layer 300. For example, the insertion layer 250 may be a metal layer or a metal oxide layer including at least one selected from the group consisting of or including Cr, Ru, Pd, Ta, and Pt.

A thickness of the insertion layer 250 may be relatively small. For example, the insertion layer 250 may have a thickness less than or equal to about 1 nm. When the insertion layer 250 has a relatively small thickness, the insertion layer 250 may modify the characteristics of an interface between the magnetic layer 200 and the second non-magnetic layer 300. The metal concentration of the insertion layer 250 may be greater than the metal concentration of the second non-magnetic layer 300, and the atomic number of a metal included in the insertion layer 250 may be higher than the atomic number of a metal included in the second non-magnetic layer 300. Thus, the insertion layer 250 may enhance the Rashba effect. Accordingly, the density of a critical current for moving magnetic domains and magnetic domain walls may be further reduced.

Figure 5:
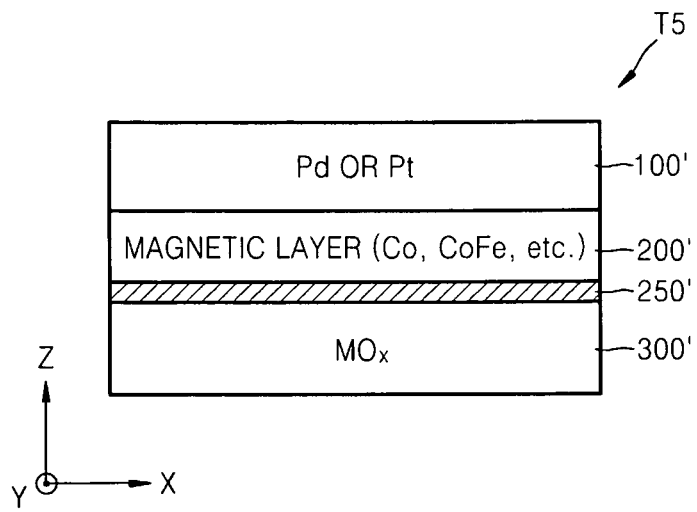

FIG. 5 illustrates a track according to yet another example embodiment.

Referring to FIG. 5, the track T5 has a multi-layer structure in which a first non-magnetic layer 100' is formed on an upper surface of a magnetic layer 200' and an insertion layer 250' and a second non-magnetic layer 300' are sequentially formed on a lower surface of the magnetic layer 200'. The first non-magnetic layer 100', the magnetic layer 200', the insertion layer 250', and the second non-magnetic layer 300' may correspond to the first non-magnetic layer 100, the magnetic layer 200, the insertion layer 250, and the second non-magnetic layer 300, respectively, of FIG. 4. The track T5 may be regarded as having the same or substantially the same structure as the track T4, but reversed. However, in order for the magnetization of the magnetic layer 200' to be perpendicularly oriented by the first non-magnetic layer 100' in the track T5, the first non-magnetic later 100' is formed of a metal such as Pd or Pt. When the first non-magnetic layer 100' is formed of an AlN layer, it may be relatively difficult to perpendicularly orient magnetization of the magnetic layer 200'. However, according to circumstances, the first non-magnetic layer 100' may not be used to perpendicularly orient the magnetization of the magnetic layer 200', and thus, the material for the first non-magnetic layer 100' is not limited to the above-described metal such as Pd or Pt.

In the track T5 shown in FIG. 5, the density of a critical current for moving magnetic domains and magnetic domain walls may be reduced by the Rashba effect, such as described above with regard to the track T4 illustrated in FIG. 4.

Hereinafter, a method of forming a track according to an example embodiment will be described relatively briefly. Layers of the tracks T1 through T5 may be formed using a typical thin film deposition process used in semiconductor processes. In addition, for perpendicular magnetization of the magnetic layers 2, 2', 20, 200, and 200', the second non-magnetic layers 3, 3', 30, 300, and 300' ($MO_x$) may be formed via plasma oxidation or the tracks T1 through T5 may be annealed at a given, desired or predetermined temperature. The annealing temperature may be less than or equal to about 400° C. The plasma oxidation and the annealing are optional. For example, according to the structure and materials of the tracks T1 through T5, the magnetic layers 2, 2', 20, 200, and 200' may be perpendicularly magnetized without the plasma oxidation or the annealing. Also, the magnetic layers 2, 2', 20, 200, and 200' described here have perpendicular magnetic anisotropy, but may also be formed using materials and structures having in-plane magnetic anisotropy. Accordingly, the first non-magnetic layers 1, 1', 10, 100, and 100' may not perpendicularly orient the magnetization of the magnetic layers 2, 2', 20, 200, and 200', respectively.

Figure 6:
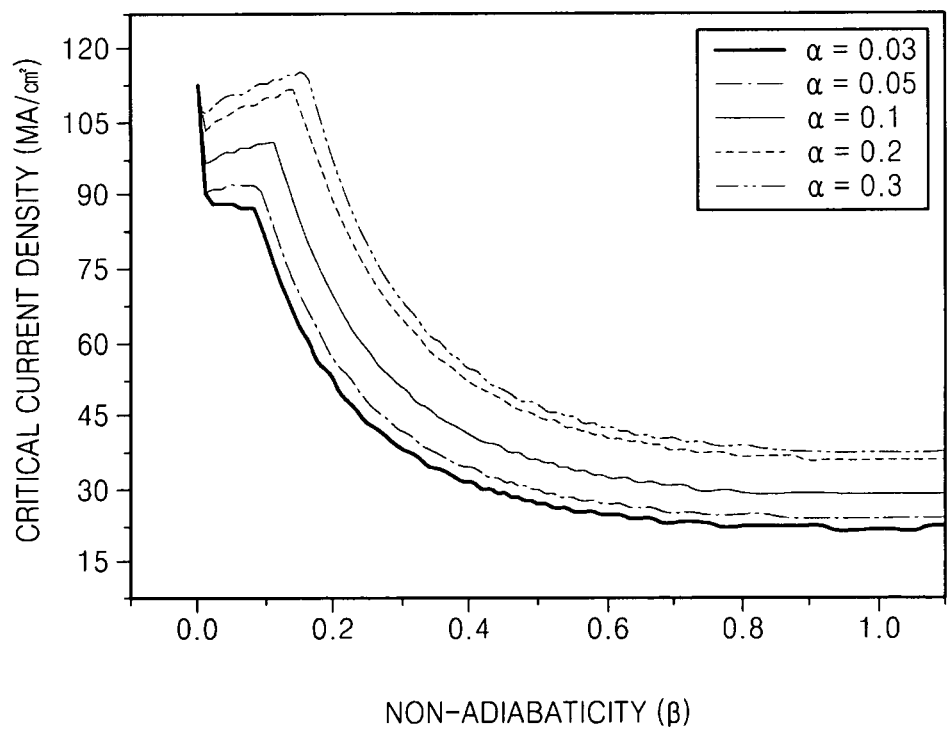
FIG. 6 is a graph showing example variations in density of a critical current for moving a magnetic domain wall according to the non-adiabaticity ($\beta$) of a magnetic layer of a track, according to an example embodiment.

FIG. 6 is a graph showing example variations in density of a critical current for moving magnetic domain walls according to the non-adiabaticity ($\beta$) of a magnetic layer of a track according to an example embodiment. FIG. 6 shows example results for a plurality of tracks having magnetic layers with different damping constants ($\alpha$).

Referring to FIG. 6, when the non-adiabaticity ($\beta$) is greater than about 0.1 to about 0.15, the density of a critical current decreases as the non-adiabaticity ($\beta$) increases. Moreover, the density of the critical current begins to decrease when the non-adiabaticity ($\beta$) of a magnetic layer is in the range of about 0.1 to about 0.15, but a point where the density of the critical current starts to decrease may vary according to the structure and material of a track. Also, as the damping constant ($\alpha$) decreases, the density of the critical current tends to decrease.

In an $AlN/Co/PtO_x$ structure according to one or more example embodiments, the non-adiabaticity ($\beta$) is about 1.0, whereas in a Pt/Co/Pt structure according to a comparative example, the non-adiabaticity ($\beta$) is about 0.02. Accordingly, based on FIG. 6, the density of the critical current may be reduced to about ⅓ compared to the comparative example.

The tracks described above may be used in a magnetic memory device that uses motion of magnetic domain walls. An example magnetic memory device is illustrated in FIG. 7.

Figure 7:
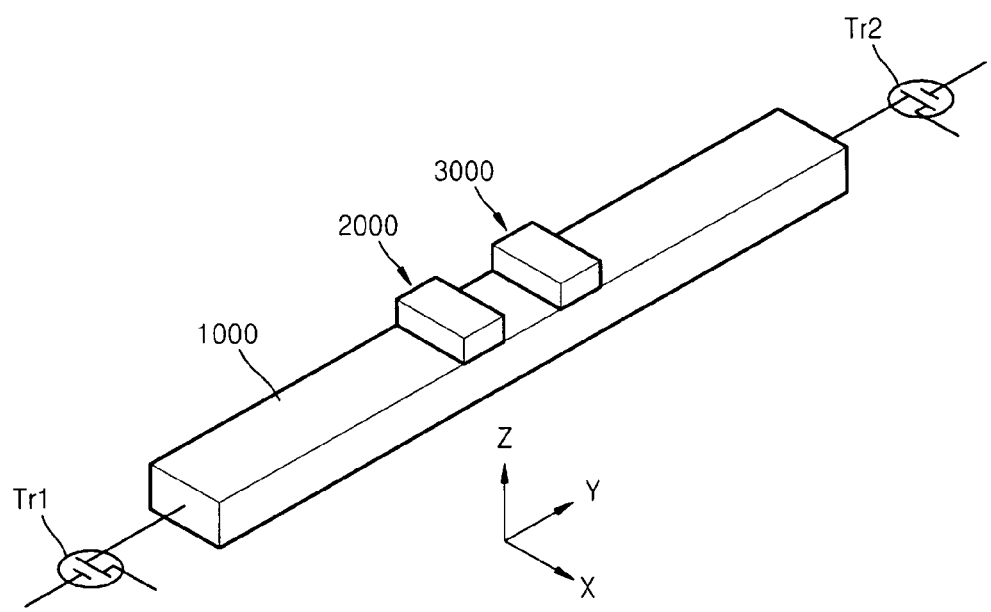
FIG. 7 is a perspective view illustrating a magnetic memory device including a track according to an example embodiment.

FIG. 7 is a perspective view illustrating a magnetic memory device including a track and using motion of magnetic domain walls according to an example embodiment.

Referring to FIG. 7, the track 1000 extends in a given, desired or predetermined direction (e.g., the Y-axis direction). The track 1000 may have the same or substantially the same structure as one of the tracks T1 through T5 described above. The track 1000 includes a plurality of magnetic domains that are serially and continuously arranged along the extension direction (e.g., the Y-axis direction). A magnetic domain wall is disposed between each pair of adjacent magnetic domains. The track 1000 may be used as an information storage element that stores information or data (e.g., bit or multi-bit) in each magnetic domain. The shape of the track 1000 is not limited to FIG. 7 and may be varied.

At least one of two ends of the track 1000 may be connected to a transistor. In FIG. 7, each end of the track 1000 is connected to one of first and second transistors Tr1 and Tr2. At least one of the first and second transistors Tr1 and Tr2 may be connected to a current source (not shown). The current source and the first and second transistors Tr1 and Tr2 may constitute a magnetic domain wall moving unit that is connected to the track 1000. By applying a given, desired or predetermined current to the track 1000 using the current source and the first and second transistors Tr1 and Tr2, magnetic domains and magnetic domain walls may be moved within the track 1000. By turning on or off the first and second transistors Tr1 and Tr2, a direction of the current may be controlled. According to the direction of the current, a motion direction of the magnetic domains and magnetic domain walls changes. The direction of the current is opposite to the direction of electrons, and thus, the magnetic domains and the magnetic domain walls move in the direction opposite to the current. Instead of connecting each end of the track 1000 to a respective one of the first and second transistors Tr1 and Tr2, one or more transistors may be connected to only one of the ends of the track 1000. Instead of the transistor, another switching device such as a diode may be used. The magnetic domain wall moving unit may also be modified variously.

A read unit 2000 and a write unit 3000 may be formed on a given, desired or predetermined area or portion of the track 1000. Each of the read unit 2000 and the write unit 3000 may have a length corresponding to one magnetic domain. The read unit 2000 may be a giant magneto resistance (GMR) sensor using a GMR effect or a tunnel magneto resistance (TMR) sensor using a TMR effect. The write unit 3000 may be a GMR or TMR recording device. Also, the write unit 3000 may be a device that writes information using an external magnetic field. In this case, the write unit 3000 may be separated from the track 1000 by a given, desired or predetermined distance. The reading and writing mechanisms, structures, and positions of the read unit 2000 and the write unit 3000 are not limited to the above description and/or drawing, but may be modified variously. For example, instead of including both the read unit 2000 and the write unit 3000, a single read/write unit performing both reading and writing may be included. Also, the read unit 2000 and the write unit 3000 may be formed on a lower surface of the track 1000 instead of an upper surface of the track 1000, or on a lateral surface of the track 1000.

While moving magnetic domains and magnetic domain walls in units of bits by applying a current to the track 1000, information is reproduced or recorded by the read unit 2000 or the write unit 3000, respectively. Accordingly, the magnetic memory device of FIG. 7 is an information storage device using motion of magnetic domain walls.

According to at least this example embodiment, because a density of a critical current for moving magnetic domains and magnetic domain walls of the track 1000 is relatively low, power consumption of the magnetic memory device may be relatively low, and Joule heating problems may be suppressed and/or prevented. Also, because a size of a device for applying a current to move the magnetic domains (e.g., sizes of the first and second transistors Tr1 and Tr2 of FIG. 7) and the magnetic domain walls may be reduced, the integration degree of a magnetic memory device may be increased.

While some example embodiments have been particularly shown and described with reference to the drawings, example embodiments should be considered in descriptive sense only and not for purposes of limitation. For example, it will be understood by those skilled in the art that the tracks according to example embodiments may be applied not only to the information storage device (memory) as illustrated in FIG. 7, but also to other areas in which motion of magnetic domain walls may be applied. Also, the structures of the tracks of FIGS. 1 through 5 and 7 may be modified variously. In more detail, for example, the magnetic layers 2, 2', 20, 200, and 200' may be formed of materials and structures having in-plane magnetic anisotropy instead of the perpendicular magnetic anisotropy, and the first non-magnetic layers 1, 1', 10, 100, and 100' may not be an orientation layer for perpendicularly orientating the magnetization of the magnetic layers 2, 2', 20, 200, and 200'. Further, the second non-magnetic layers 3, 3', 30, 300, and 300' may be formed of other metal compounds than a metal oxide. Therefore, the scope is defined not by the detailed description, but by the appended claims.

What is claimed is:

1. A magnetic memory device comprising:
a track including,
a magnetic layer having a plurality of magnetic domains and a magnetic domain wall between each pair of adjacent magnetic domains,
a first non-magnetic layer formed on a first surface of the magnetic layer, and
a second non-magnetic layer formed on a second surface of the magnetic layer, the second non-magnetic layer being a metal oxide layer formed of a different material than the first non-magnetic layer, and the second non-magnetic layer comprising magnesium (Mg) and/or at least one selected from the group including metals having an atomic number greater than or equal to 14;
a magnetic domain wall moving unit connected to the track; and
a read/write unit configured to reproduce/record information with respect to the track.

2. The magnetic memory device of claim 1, wherein the magnetic layer has perpendicular magnetic anisotropy.

3. The magnetic memory device of claim 2, wherein the first non-magnetic layer is an orientation layer by which magnetization of the magnetic layer is perpendicularly oriented.

4. The magnetic memory device of claim 1, wherein the first non-magnetic layer is a metal layer.

5. The magnetic memory device of claim 4, wherein the metal layer includes Pd or Pt.

6. The magnetic memory device of claim 1, wherein the metal having an atomic number greater than or equal to 14 comprises:
at least one selected from the group including Cr, Ru, Pd, Ta, and Pt.

7. The magnetic memory device of claim 1, wherein a non-adiabaticity ($\beta$) of the magnetic layer is greater than or equal to about 0.1.

8. A magnetic memory device comprising:
a track including,
a magnetic layer having a plurality of magnetic domains and a magnetic domain wall between each pair of adjacent magnetic domains,
a thermal-conductive insulating layer formed on a first surface of the magnetic layer, and
a non-magnetic layer formed on a second surface of the magnetic layer,
the non-magnetic layer including a metal having an atomic number greater than or equal to 12;
a magnetic domain wall moving unit connected to the track; and
a read/write unit configured to reproduce/record information with respect to the track; wherein
the thermal-conductive insulating layer includes AlN, and the non-magnetic layer is a metal oxide layer.

9. The magnetic memory device of claim 8, wherein the metal having an atomic number greater than or equal to 12 comprises:
at least one selected from the group including Mg, Al, Cr, Ru, Pd, Ta, and Pt.

10. The magnetic memory device of claim 8, wherein the magnetic layer has perpendicular magnetic anisotropy.

11. The magnetic memory device of claim 10, wherein the thermal-conductive insulating layer is an orientation layer by which magnetization of the magnetic layer is perpendicularly oriented.

12. A magnetic memory device comprising:
a track including,
a magnetic layer having a plurality of magnetic domains and a magnetic domain wall between each pair of adjacent magnetic domains,
a thermal-conductive insulating layer formed on a first surface of the magnetic layer, and
a non-magnetic layer formed on a second surface of the magnetic layer, the non-magnetic layer including a metal having an atomic number greater than or equal to 12;
a magnetic domain wall moving unit connected to the track; and
a read/write unit configured to reproduce/record information with respect to the track, wherein
the thermal-conductive insulating layer includes AlN.

13. The magnetic memory device of claim 8, wherein a non-adiabaticity ($\beta$) of the magnetic layer is greater than or equal to about 0.1.

14. A magnetic memory device comprising:
a track including,
a magnetic layer having a plurality of magnetic domains and a magnetic domain wall between each pair of adjacent magnetic domains,
a first non-magnetic layer formed on a first, surface of the magnetic layer;
a second non-magnetic layer formed on a second surface of the magnetic layer, the second magnetic layer including a metal having an atomic number greater than or equal to 12, and
an insertion layer disposed between the magnetic layer and the second non-magnetic layer, the insertion layer including a metal having an atomic number greater than or equal to 14, and having a metal concentration that is greater than a metal concentration of the second non-magnetic layer;
a magnetic domain wall moving unit connected to the track; and
a read/write unit configured to reproduce/record information with respect to the track.

15. The magnetic memory device of claim 14, wherein the magnetic layer has perpendicular magnetic anisotropy.

16. The magnetic memory device of claim 15, wherein the first non-magnetic layer is an orientation layer by which magnetization of the magnetic layer is perpendicularly oriented.

17. The magnetic memory device of claim 14, wherein the first non-magnetic layer is one of a metal layer and an insulating layer.

18. The magnetic memory device of claim 14, wherein the second non-magnetic layer is a metal oxide layer.

19. The magnetic memory device of claim 14, wherein the metal having an atomic number greater than or equal to 12 comprises:

at least one selected from the group including Mg, Al, Cr, Ru, Pd, Ta, and Pt.

20. The magnetic memory device of claim 14, wherein the insertion layer is one of a metal layer and a metal oxide layer.

21. The magnetic memory device of claim 14, wherein the metal having an atomic number greater than or equal to 14 comprises:

at least one selected from the group including Cr, Ru, Pd, Ta, and Pt.

22. The magnetic memory device of claim 14, wherein a thickness of the insertion layer is less than or equal to about 1 nm.

23. The magnetic memory device of claim 14, wherein the atomic number of a metal included in the insertion layer is greater than or equal to the atomic number of a metal included in the second non-magnetic layer.

24. The magnetic memory device of claim 14, wherein a non-adiabaticity (β) of the magnetic layer is greater than or equal to about 0.1.

25. A magnetic memory device comprising:

a track including,
   a magnetic layer having a plurality of magnetic domains and a magnetic domain wall between each pair of adjacent magnetic domains,
   a first non-magnetic layer formed on a first surface of the magnetic layer, and
   a second non-magnetic layer formed on a second surface of the magnetic layer, the second non-magnetic layer being formed of a different material than the first non-magnetic layer, and the second non-magnetic layer including at least one of magnesium (Mg) and at least one selected from the group including metals having an atomic number greater than or equal to 14;

a magnetic domain wall moving unit connected to the track;

a read/write unit configured to reproduce/record information with respect to the track; and wherein the first non-magnetic layer is a metal layer and the second non-magnetic layer is a metal compound layer.

* * * * *